United States Patent
Lin

(10) Patent No.: US 6,730,967 B2
(45) Date of Patent: May 4, 2004

(54) ELECTROSTATIC DISCHARGE PROTECTION DEVICES AND METHODS FOR THE FORMATION THEREOF

(75) Inventor: Shi-Tron Lin, Taipei (TW)

(73) Assignee: Winbond Electronics Corp., Hsinchu (TW)

( * ) Notice: Subject to any disclaimer, the term of this patent is extended or adjusted under 35 U.S.C. 154(b) by 0 days.

(21) Appl. No.: 09/863,977

(22) Filed: May 24, 2001

(65) Prior Publication Data

US 2002/0175377 A1 Nov. 28, 2002

(51) Int. Cl.$^7$ .......................... H01L 23/62; H01L 29/76
(52) U.S. Cl. .................. 257/355; 257/356; 257/357; 257/358; 257/360; 257/382
(58) Field of Search ............................... 257/355–358, 257/360, 382

(56) References Cited

U.S. PATENT DOCUMENTS

| | | | | | |
|---|---|---|---|---|---|
| 4,825,280 A | * | 4/1989 | Chen et al. | ................. | 257/659 |
| 5,517,051 A | * | 5/1996 | Chatterjee | .................. | 257/360 |
| 5,721,439 A | * | 2/1998 | Lin | ............................ | 257/204 |
| 5,844,280 A | * | 12/1998 | Kim | ............................ | 257/355 |
| 6,002,156 A | * | 12/1999 | Lin | ............................ | 257/356 |
| 6,046,087 A | * | 4/2000 | Lin et al. | .................... | 438/279 |
| 6,100,125 A | * | 8/2000 | Hulfachor et al. | .......... | 438/224 |
| 6,111,295 A | * | 8/2000 | Arai | ........................... | 257/392 |
| 6,304,127 B1 | * | 10/2001 | Lin | ............................ | 327/321 |
| 6,469,354 B1 | * | 10/2002 | Hirata | ........................ | 257/358 |
| 6,479,872 B1 | * | 11/2002 | Cheng et al. | ................ | 257/360 |
| 2001/0023965 A1 | * | 9/2001 | Ikeda et al. | .................. | 257/368 |

* cited by examiner

*Primary Examiner*—Amit Zarabian
*Assistant Examiner*—Ida M. Soward
(74) *Attorney, Agent, or Firm*—Ladas & Parry

(57) ABSTRACT

The present invention provides an ESD protection device with isolated islands and an n well. At least one of the isolated islands has an end apart from the boundary of a drain diffusion region of the ESD protection device, to form a gap between. The n well overlaps with the isolated islands and is kept at least a designated distance away from a channel region of the ESD protection device. An interlocked structure of isolated islands is also provided in this invention to direct ESD current flowing forward and backward to the channel region of the ESD protection device, thereby increasing the distributed resistance of the drain diffusion region. Several benefits, such as lower drain capacitance, lower standby power consumption and a wider range of adjustable resistance, are achieved.

44 Claims, 10 Drawing Sheets

ELECTROSTATIC DISCHARGE PROTECTION DEVICES AND METHODS FOR THE FORMATION THEREOF

BACKGROUND OF THE INVENTION

1. Field of the Invention

The present invention relates to electrostatic discharge (ESD) protection devices and relevant methods for forming those devices. In particular, the present invention relates to ESD protection devices with islands for constraining ESD current flow and wells thereunder for the prevention of substrate leakage.

2. Description of the Related Art

As products based on integrated circuitry (ICs) become more delicate, they also become more vulnerable to the effects of external environment, especially to ESD stress occurring when one pin of an IC is grounded and anther pin of the IC contacts an electrostatically-precharged object. Therefore, input pins, output pins, input/output pins, the power-bus pins for an IC for communicating with external systems, must all be well equipped with ESD protection devices or circuitry to meet the minimum level of ESD robustness required by commercial applications.

NMOS devices, either with the gate grounded or with the gate coupled to a positive voltage during an ESD event, have commonly been used as primary ESD protection devices for ICs. It is well known that the drain contact of an NMOS device must be kept a few microns apart from the gate of the NMOS device. What is implied is that the drain side of an NMOS device confronting ESD stress in the front line must have a distributed resistor connected in series between the channel under the gate and a coupled pad, and the resistance of the distributed resistor must be larger than an acceptable value. If the ESD transient current starts to localize at a weak spot near the gate, it causes the entire ESD current to rush in, thereby causing local heating and eventually damaging the NMOS device. On the other hand, the distributed resistor helps to raise the potential of the adjacent diffusion area, and hence induce a more uniform ESD current flow towards the whole channel.

The advanced salicide process, which forms silicide material on drain/source regions to reduce the resistance of active regions and speeds up the circuit operation rate, however, makes construction of the above-mentioned resistor more difficult and costly.

One known solution for the problems induced by the salicide process is to use the salicide block process, which blocks the formation of silicide on certain diffusion regions. However, this solution is inefficient due to the process complexity and the extra mask required.

U.S. Pat. No. 5,721,439 (hereafter referred as '439 patent) discloses an MOS transistor structure comprising a number of isolated islands in the drain diffusion region (as shown in FIG. 1). The ESD transient current flows around these isolated islands from the drain contacts 10, toward the drain-gate edge, thereby increasing drain resistance to improve ESD protection. Due to the manufacture of plasma treatment or carrier ejection in high electric field operations, however, these isolated islands may trap some negative charges inside the isolator material, enhancing recognized gate-induced-drain-leakage (GIDL) current and, therefore, unnecessarily increase standby power consumption.

U.S. Pat. No. 5,248,892 (hereafter referred as '892 patent) discloses an MOS transistor structure comprising a resistor means whose width is substantially equal to the width of the active zone, wherein the resistor means comprises a number of strips of titanium silicide extending substantially parallel to each to increase drain resistance. U.S. Pat. No. 6,046,087 (hereafter referred as '087 patent) discloses an ESD protection device using a second gate as silicide-blocking mask for the drain region, wherein the second gate overlies an N-well region and separates the drain of the host transistor into two portions. These two mentioned patents both encounter the problem of the resistor means ('892) or the second gate ('087) contributing resistance rendered un-reducible by the limitation of design rule. In other words, there is a range of resistance unachievable if a drain layout is implemented according to '892 or '087 patents.

SUMMARY OF THE INVENTION

An object of the present invention is to prevent the occurrence of GIDL current and maintain standby power consumption at a reasonable level.

Another object of the present invention is to provide an ESD protection device that has a distributed resistor with a wider adjustable resistance in its drain side.

Another object of the present invention is to provide a way of re-directing current flow in the drain side of an ESD protection to increase the resistance of the distributed resistor.

The ESD protection device according to the present invention comprises a semiconductor bulk of a first conductivity type, a first doped region of a second conductivity type, a second doped region of the second conductivity type, a channel region, at least one island, and a well of the second conductivity type. The first doped region and the second doped region are formed in the semiconductor bulk. The first doped region further has a boundary. The channel is formed between the first doped region and the second doped region. The island with one end is formed in the first doped region to form a gap between the end and the boundary of the first doped region. The well is formed in the semiconductor bulk, overlaying with the island and being kept at a design distance from the channel region. The well may partially or entirely overlap the island.

In view of the existence of the well, even though the island has trapped charges inside, GIDL current, which flows from a drain side to the substrate under the negative-biased gate, will be limited since at least part of the island overlaps the well. Further, the well also contributes to a lower PN junction capacitance coupling the first doped region and makes the ESD protection device of the present invention more suitable for high speed input/output application.

The wider the gap, the smaller the distributed resistance of the first doped region is. It implies that the distributed resistance of the first doped region can be fine-tuned to a reasonably low level.

Another ESD protection device according to the present invention comprises a semiconductor bulk of a first conductivity type, a first doped region of a second conductivity type, a second doped region of the second conductivity type, a channel region and an array of islands. The first and the second doped regions are formed in the semiconductor bulk. The channel region is formed between the first doped region and the second doped region. The array of islands is distributed at least in the first doped region to force ESD current flowing both backward and forward toward to the channel region. The forward and backward directions are oriented between 90 and 270 degrees of each other.

With the assistance of the islands, ESD current in the first doped region is forced to flow in a serpentine way, forward and backward, toward the channel, such that the distributed resistance of the first doped region is significantly enlarged.

Another aspect of the present invention provides a method of forming an ESD protection device. A well of a second conductivity type is formed in a semiconductor bulk of a first conductivity type. An island overlapping with the well is formed on (or over) the semiconductor bulk. A channel region is formed in the semiconductor bulk and is kept at a designated distance from the well. A first doped region and a second doped region of the second conductivity type are formed adjacent to two sides of the channel region, respectively, wherein the first doped region overlaps the well and the island. The island has one end separated from a boundary of the first doped region to form a gap inside the first doped region.

Another aspect of the present invention provides a method of forming an ESD protection device. A plurality of islands is formed on (or over) a semiconductor bulk of a first conductivity type. A channel region is formed in the semiconductor bulk. A first doped region and a second doped region are formed adjacent to two sides of the channel region, respectively. The first doped region overlaps the islands, which forces ESD current in the first doped region to flow both backward and forward to the channel region.

DETAILED DESCRIPTION OF THE PREFERRED EMBODIMENT

Figure 1:
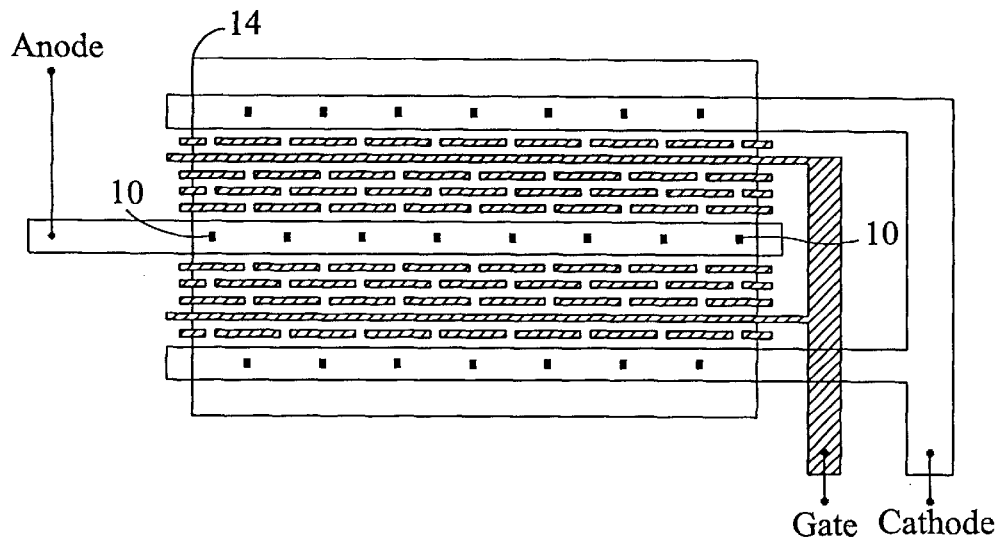
FIG. 1 is a top view of an ESD protection device according to the '439 patent.
Figure 2:
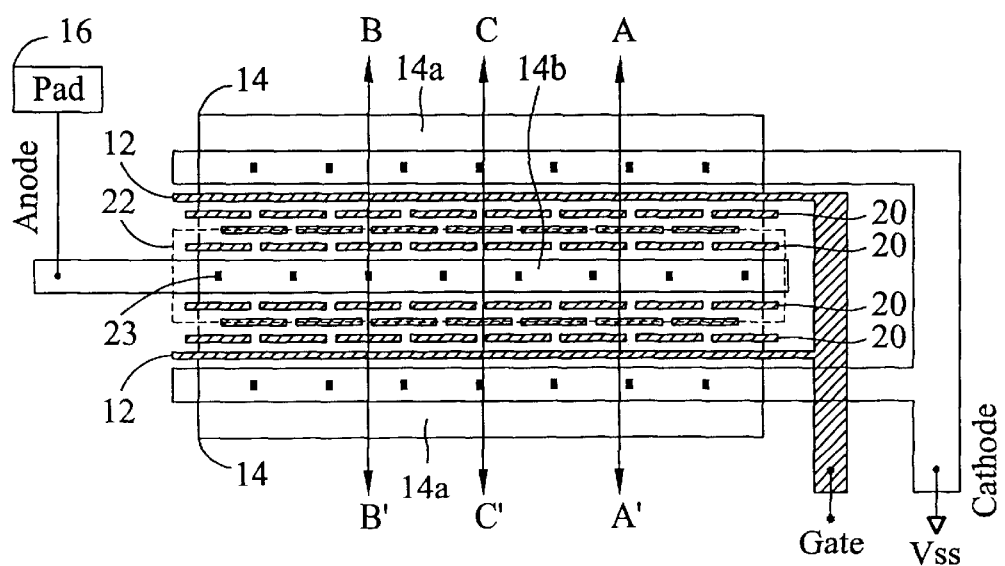
FIG. 2 shows a top-view, a layout example, of an ESD protection device according to the present invention.

FIG. 2 shows a top-view, a layout example, of an ESD protection device according to the present invention. The ESD protection device in FIG. 2 is a multi-finger-type NMOS with two poly gates 12 coupled together. An active region 14 is surrounded by an isolation region, which is typically formed by a field oxide region or a shallow trench isolation (STI) region. The active region 14 is typically ion-implanted by negative-type ions and then annealed by thermal cycles to form heavily n-doped (n+) regions. Such ion implant is blocked by any poly gate, poly segment or field oxide segment present within the active region. Within the active region 14, two channel regions under the poly gates 12 are formed. The portion of the active region 14 between the two poly gates 12 is referred to as a drain diffusion region 14b, serving as an anode and coupled to a pad 16, and the portions of the active region 14 sandwiching the two poly gates in between are referred to as source diffusion regions 14a, serving as a cathode and coupled to a Vss power rail. The drain and source diffusion regions (14a and 14b) are separated by the poly gates 12 as well as the channel underneath the poly gates 12.

Isolated islands 20, consisting of poly segments 36 with thin gate oxide segments 38 thereunder, are distributed in the drain diffusion region 14b. At least part of the isolated islands 20 overlaps with an n well region 22, which also overlaps the drain diffusion region 14b.

Figure 3A:
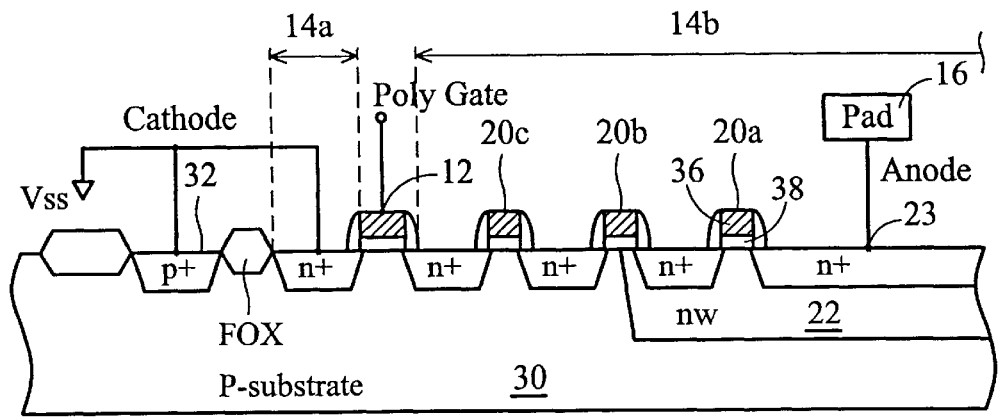
FIG. 3A illustrates the cross-section view of the structure in FIG. 2 along a portion of line A–A'.

FIG. 3A illustrates the cross-section view of the structure in FIG. 2 along a portion of line A–A'. From the right is a drain contact 23 in the drain diffusion region 14b, one row 20a of isolated islands entirely over the n well region 22, one row 20b of isolated islands partially over the n well region 22, one row 20c of isolated island entirely over p-well/p-substrate 30, a poly gate 12, a source diffusion region 14a, and finally, a p+ guard-ring region 32 (not shown in FIG. 2) in the p-well/p-substrate 30. Drain diffusion region 14b is coupled to a pad; source diffusion region 14a a and the p-well/p-substrate 30 are coupled to the Vss power rail. In FIG. 3A, each of the isolated islands 20 consists of a poly segment 36 with a thin gate oxide segment 38 underneath.

Figure 3B:
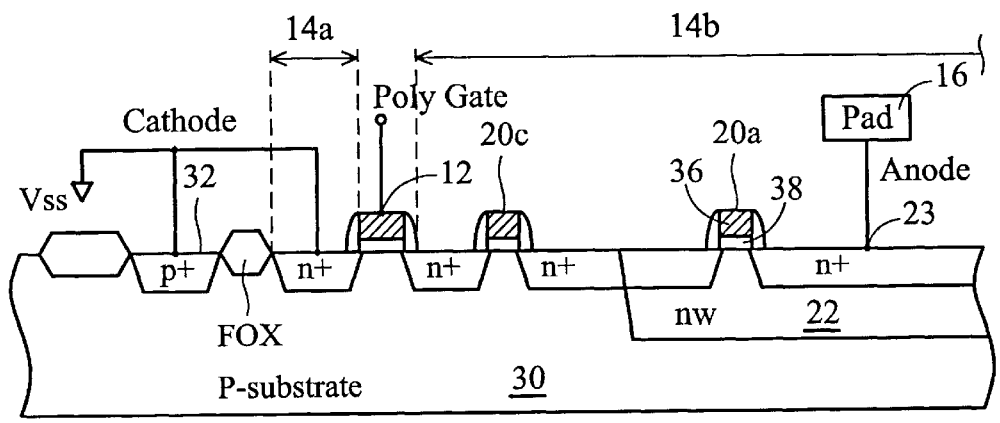
FIG. 3B illustrates the cross-section view of the structure in FIG. 2 along a portion of line B–B'.
Figure 3C:
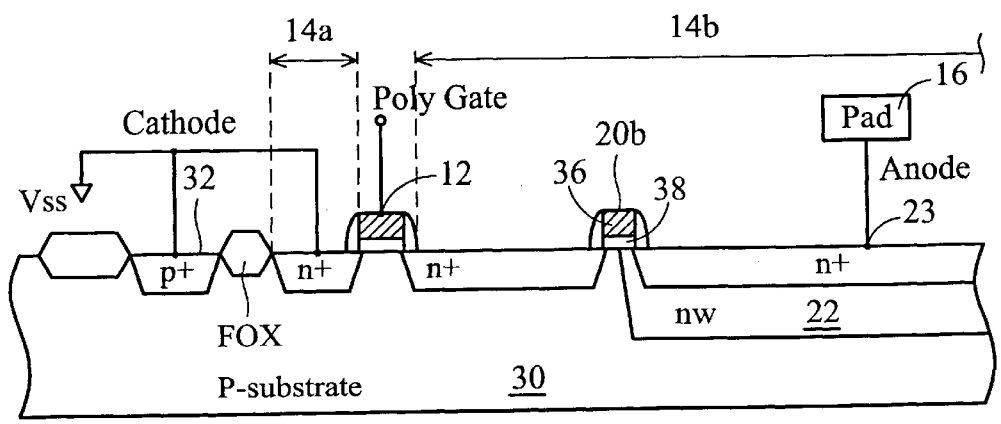

FIG. 3B illustrates the cross-section view of the structure in FIG. 2 along a portion of line B–B'. FIG. 3C illustrates the cross-section view of the structure in FIG. 2 along a portion of line C–C'.

If the n well 22 is too close to the poly gate 12, punch-through may occur during powered-on IC operation due to the wider junction of the n well. Therefore, the n well 22 is kept at or more than a minimum distance from the poly gate 12 (depending on the process and for example, 1.2 um for 0.35 um process technology).

During an ESD event, for example, a positive transient voltage pulse may appear at the anode, and the current flows from the drain contacts 23 in the drain diffusion region 14b toward the drain-gate edge. From the structure described in FIGS. 2 and 3A–3C, there are two current paths in parallel:

(a) The first current path is around the isolated islands 20, which has a relatively low resistance due to a heavier doped concentration (n+). In the case of salicide or silicided drain process, this path resistance is even lower.

(b) The second current path is through the n well 22 under the isolated islands 20, which has a relatively high resistance due to the lighter doped concentration of the n well 22.

Since these two current paths work in parallel, the resultant drain distributed resistance to pass the ESD current is higher than the original drain resistance without any island in the drain diffusion region, but lower than the structure described in '892 or '087 patents. By fine-adjusting the profile and the number of the isolated islands 20 and the covering range of the n well 22, one can arbitrarily optimize the distributed resistance of the drain diffusion region.

If there are negative charges trapped in the isolated islands 20, the n well 22 under the isolated islands 20 separates the p-well/p-substrate 30 from the drain diffusion region 14b, such that the GIDL current never occurs to those isolated islands 20 with the n well 22 underneath. The more of the isolated island 20 that the n well overlaps, the lower the possibility of the GIDL current occurring. Thus, device stability and yield are improved.

The other advantage of the structure is its provision of a lower drain capacitance. Since the n well 22 has a lower doping concentration than the n+ region in the drain diffusion region 14b, the n well 22 to p-substrate 30 capacitance is much lower than the n+ region to the p-substrate 30 capacitance, and the resultant drain-to-substrate capacitance of the structure in FIG. 2 is much lower than the same structure without the overlapping n well.

Figure 4A:
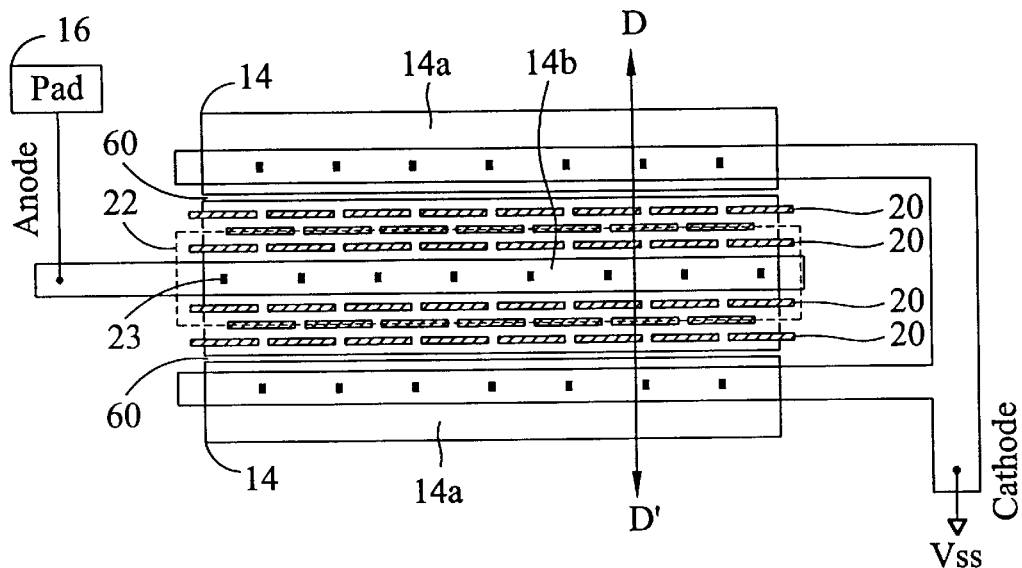
FIG. 4A shows a layout of an alternative structure according the present invention.
Figure 4B:
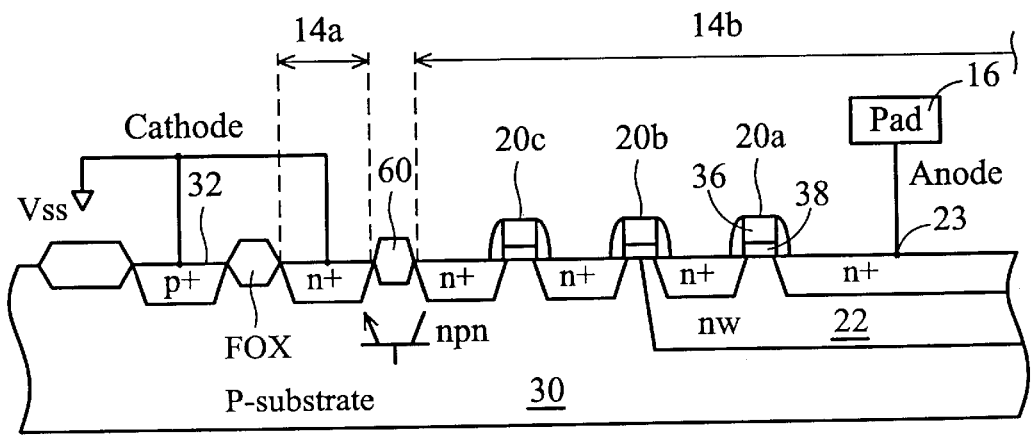
FIG. 4B illustrates the cross-section view of the structure in FIG. 4A along a portion of line D–D'.

FIG. 4A shows the layout of an alternative structure according the present invention. FIG. 4A is similar to FIG. 2 but the NMOS device in FIG. 2 is replaced by a field oxide device 60 in FIG. 4A. FIG. 4B illustrates the cross-section view of the structure in FIG. 4A along a portion of line D–D'. The field oxide device 6-having a channel under the field oxide is also a lateral-bipolar device as shown in FIG. 4B.

Figure 5A:
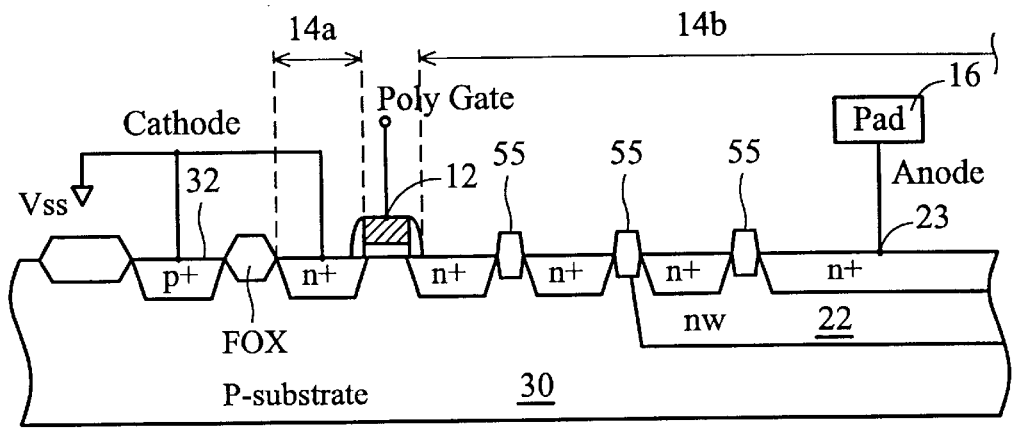
FIGS. 5A and 5B illustrate a cross-section view similar to FIGS. 3A and 4B respectively except that each combination of a poly segment and a thin gate oxide segment is replaced by a field oxide segment.
Figure 5B:
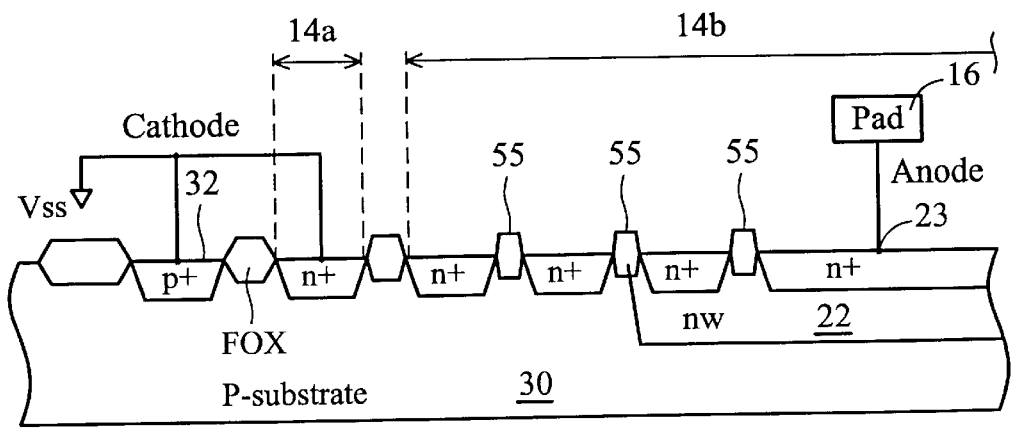

As well as the combination of a poly segment and a thin gate oxide segment, an isolated island can consist of a field oxide segment. FIG. 5A illustrates a cross-section view similar to FIG. 3A except that each combination of a poly segment and a thin gate oxide segment is replaced by a field oxide segment 55. The similar replacement for FIG. 4B is also illustrated in FIG. 5B. Alternatively, the field oxide segment can be a trench-isolation segment for a shallow trench isolation process technology.

Figure 6A:
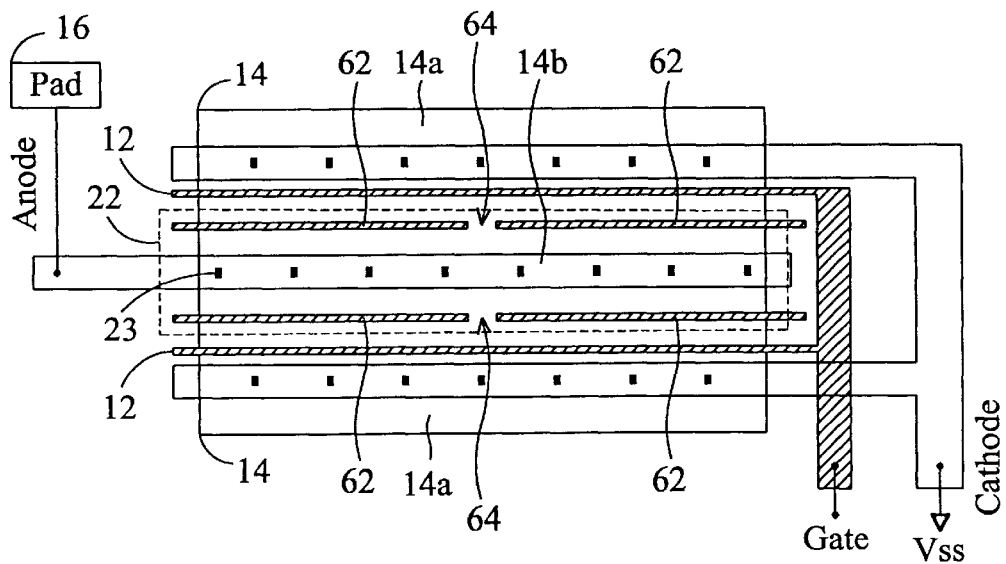
FIGS. 6A to 6C show three specific implementations of the structure shown in FIG. 2, where the islolated islands are implemented by poly segments and thin gate oxide segments.
Figure 6B:
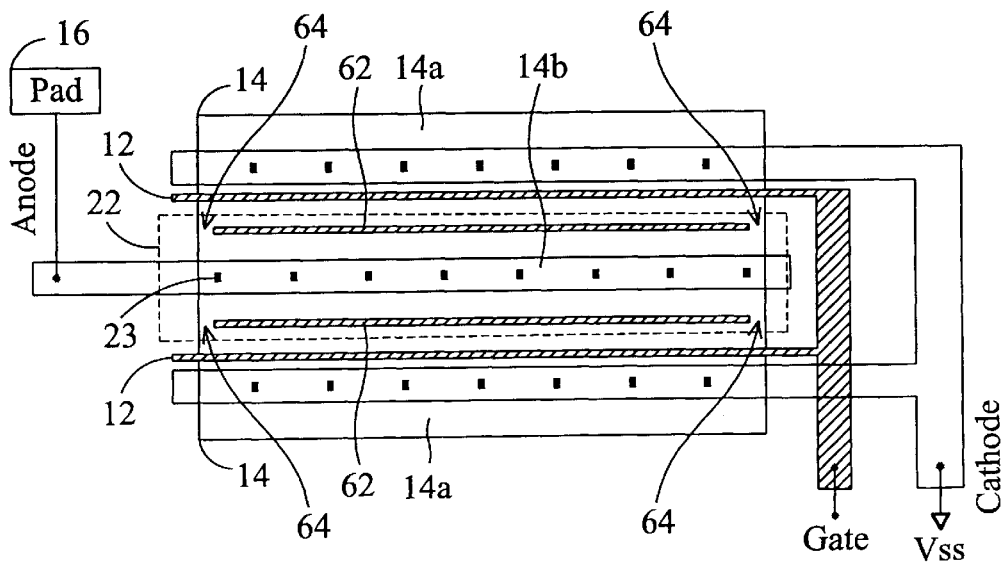
Figure 6C:
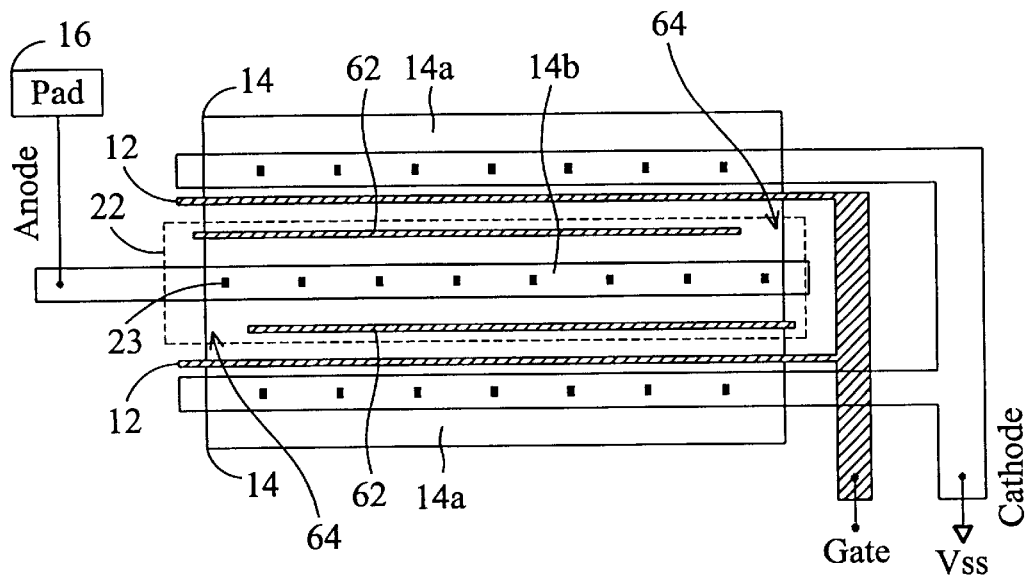

FIGS. 6A to 6C show three specific implementations of the structure shown in FIG. 2. In FIG. 6A, there are elongated isolated islands 62 extending from within the drain diffusion region 14b to the field oxide region surrounding the active region 14. For an array of isolated islands, there is only one gap 64 between two isolated islands 62. Further, the gap 64 can be located at a center position in the active region 14 along the extending direction of the poly gate. However, the gap 64 can also be in an off-center position in the drain diffusion region 14b along the extending direction of the poly gate 12. Each isolated island 62 in FIG. 6B is located within the drain diffusion region 14b to form two gaps 64 against the boundary of the drain diffusion region 14b. FIG. 6C shows another specific implementation, where each isolated island 62 has one end located on the surrounding field oxide region and the other end located inside the drain diffusion region to form a gap 64 against the boundary of the drain diffusion region 14b.

Figure 7A:
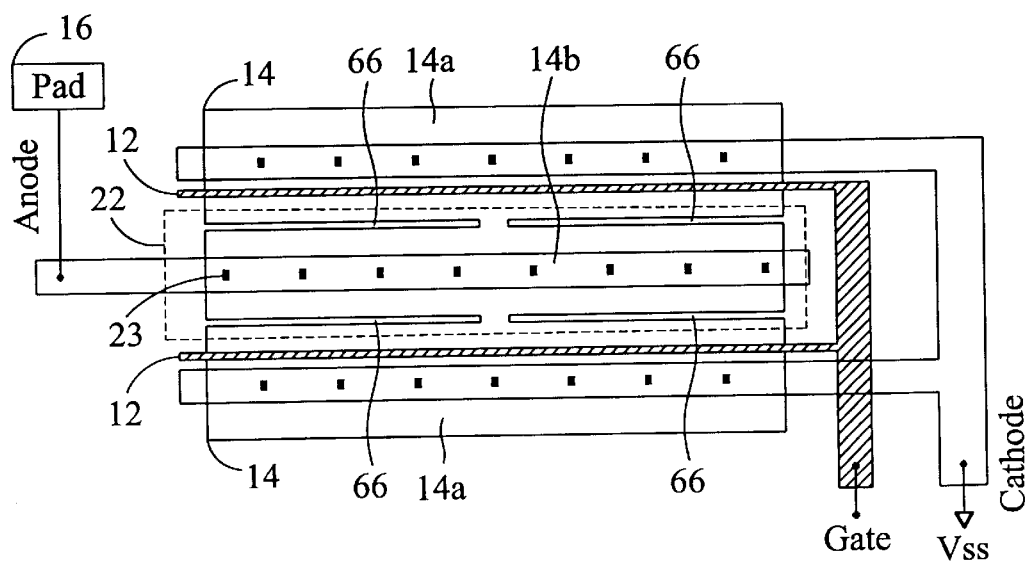
FIGS. 7A to 7C show three specific implementations with islolated islands implemented by field oxide segments.
Figure 7B:
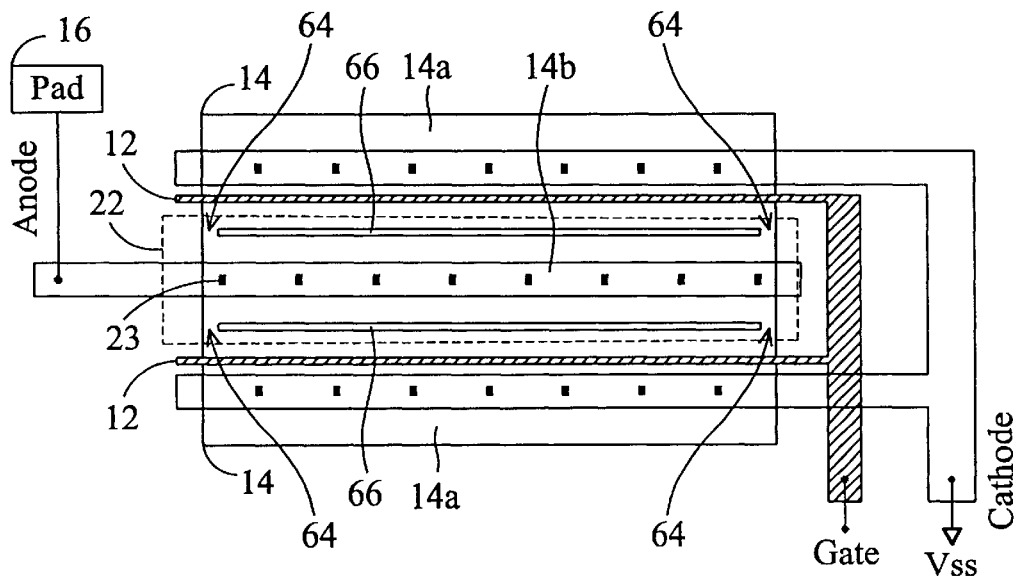
Figure 7C:
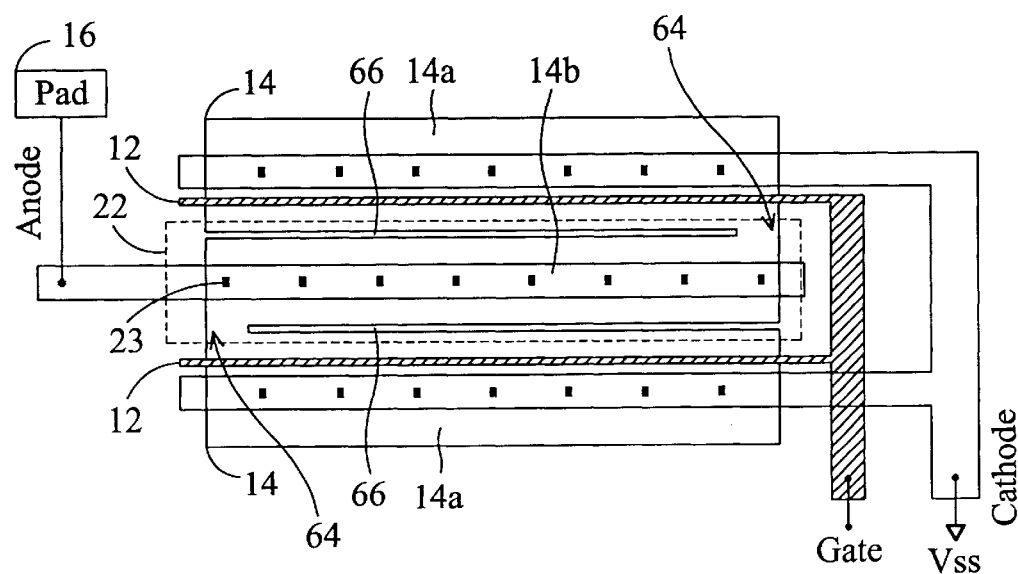

As mentioned before, in addition to the combination of a poly segment and a thin gate oxide segment, an alternative form of an isolated island is a field oxide segment (or trench isolation segment). Three specific implementations with isolated islands 66 implemented by field oxide segments are shown in FIGS. 7A to 7C, corresponding to FIGS. 6A to 6C, respectively. In FIGS. 7A to 7C, if an isolated island 66 contacts the surrounding field oxide region, the isolated island is connected to the surrounding field oxide region to form a peninsula-like pattern.

Figure 8:
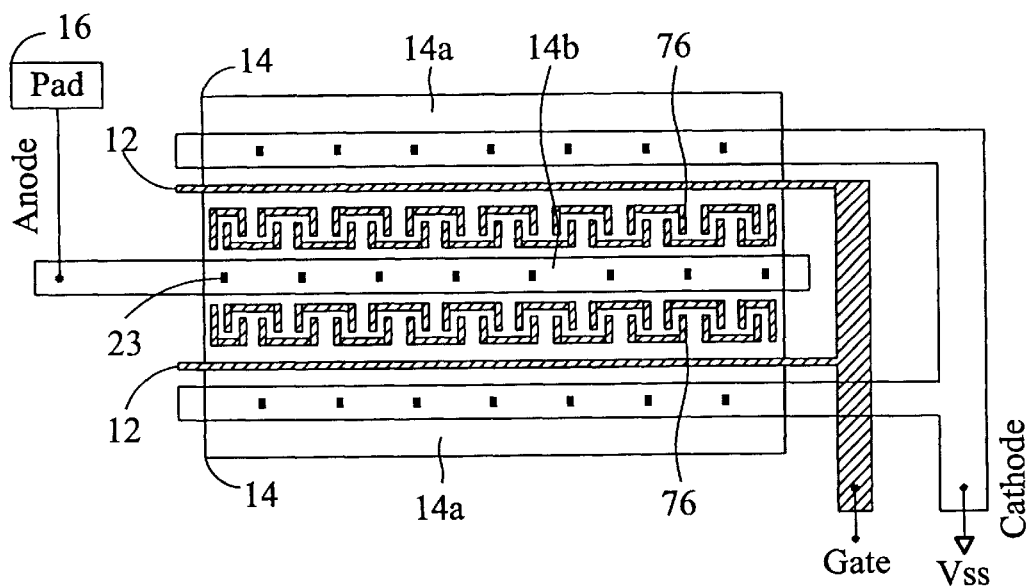
FIG. 8 shows arrays of isolated islands with "interlocked" effect.
Figure 9:
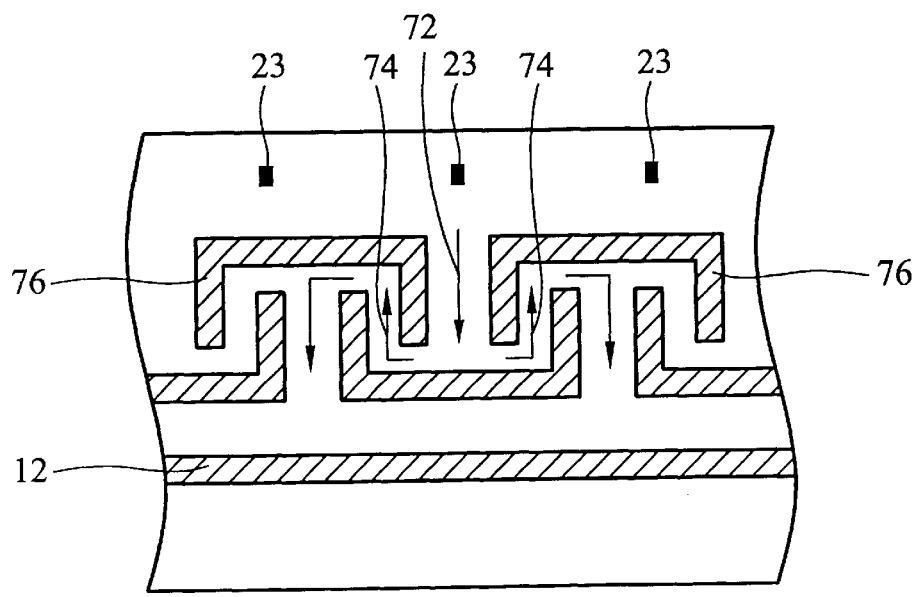
FIG. 9 enlarges portion of FIG. 8 to illustrate the forward and backward ESD current flowing from the drain contact to the poly gate.

FIG. 8 shows arrays of isolated islands 76 with an "interlocked" effect. FIG. 9 enlarges a portion of FIG. 8 to illustrate the forward and backward ESD current flowing from the drain contact 23 to the poly gate 12. This structure allows the ESD current to flow forward (toward the poly gate 12 or the channel region) and backward (away from the poly gate 12 or the channel region) thereby increasing the current path and effectively increasing the drain contact 23 to the poly gate 12 edge distance. Note that the forward and backward directions (72 and 74) do not have to be exactly opposite (180 degrees to each other). They need only be in generally opposing directions (with their directions differing by more than 90 degrees to each other).

Figure 10:
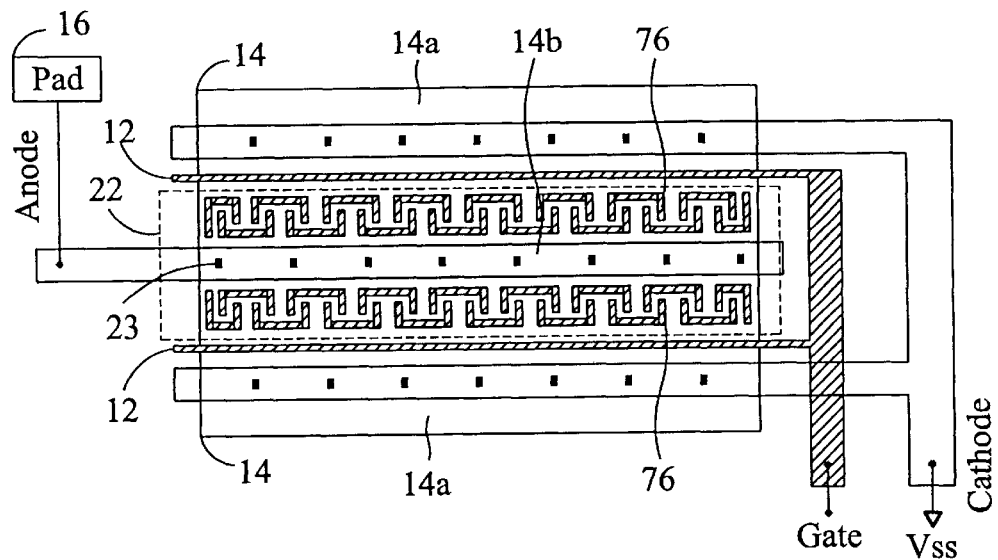
FIG. 10 shows FIG. 8 as well as an n well overlapping the interlocked array of isolated islands.
Figure 11:
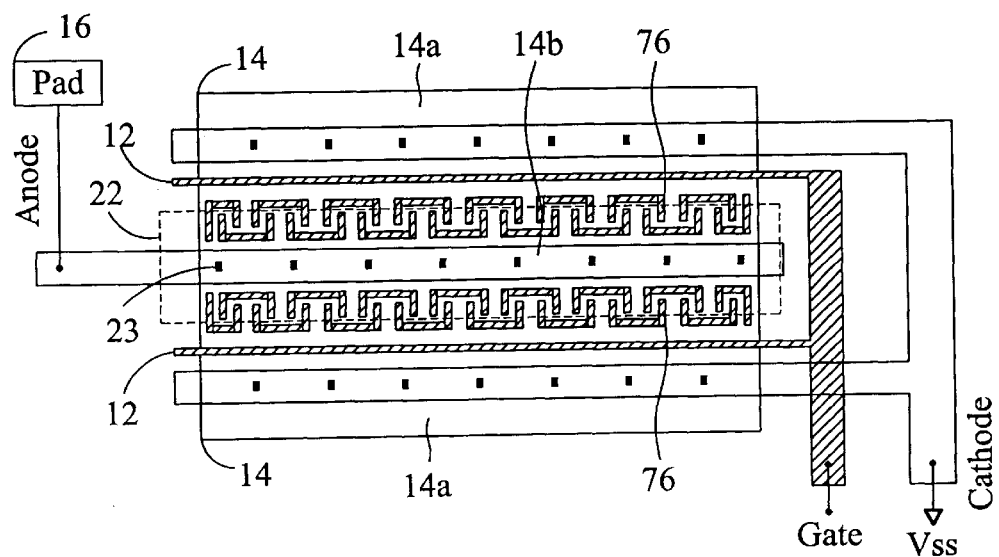
FIG. 11 is similar to FIG. 10, but has an n well partially overlapping the two arrays.

FIG. 10 shows FIG. 8 as well as an n well 22 overlapping with the interlocked array of isolated islands. The n well 22 thereunder can reduce the drain capacitance and improve the device stability. These two arrays of isolated islands 76 form an interlocked structure such that the electrical current flows at least in forward and backward directions from a drain contact 23 in the drain diffusion region 14b toward the channel region. FIG. 11 is similar to FIG. 10, but has an n well partially overlapping the two arrays. The distance between the n well 22 and the channel region must be greater than a minimum space to prevent punch-through, with the dimensions depending upon the design requirements, such as acceptable drain capacitance and resistance, the maximum input standby leakage, and other factors.

Another aspect of the invention is in the creation of a first resistivity portion and a second resistivity portion in at least one (drain) diffusion region of an ESD protection device. The first resistivity portion has at least a first zone, a second zone and a gap zone. The first zone connects to the second zone through the gap zone. The first zone is coupled to an IC pad or power bus through at least one contact. The second zone can be proximate to a channel region. The gap zone is at least in part adjacent to the second portion. The purpose of the gap zone is to increase the effective resistance between the first zone and the second zone. In one aspect, the gap zone can be adjacent to the second portion from two sides. In another aspect, the gap zone can be adjacent to the second portion on one side and to an isolation region on another side.

In another aspect, the gap zone can be substantially narrow (in the width direction as across the current flow direction) and short (in the length direction as the current flow direction) for layout-area savings. A narrow gap zone can be 0.5-to-5 um wide versus the channel width of one poly gate finger of 20-to-100 um. A short gap zone can be 0.2-to-1 urn in length versus the typical 2-to-6 um of contact to channel distance. For example, the "short" length (of 0.2-to-1 um) can be smaller than the "narrow" width (of 0.5-to-5 um) for the gap zone.

As exampled in FIGS. 2 to 3C, the first zone is the part of the n+ doped region connecting to the IC pad through contact 23, the second zone is the part of the n+ doped region next to the channel, and the gap zone is the openings between adjacent islands or between an island and the surrounding isolation region. In this example, the second resistivity portion is the n-well region underlying the island structure. In a salicide process technology, the first resistivity portion having a silicided surface has a substantially lower resistivity than the second resistivity portion. The advantages of this implementation are in (i) Initial ESD current flowing from the first zone, through at least one detour and at least one gap zone to the second zone, can arrive from the IC pad to the channel region very quickly based on the ultra low silicided-diffusion-region resistivity and associated low RC delay. This is beneficial for fast triggering of the ESD device.

(ii) After the ESD device is triggered, full and uniform activation of the ESD device is important for ESD performance. In this case, the large ESD current in part flows through the ultra low resistivity path described in (i) and in part flows from the first zone towards the second zone through the second resistivity portion.

These two current flow paths combined to form a more uniform distributed resistance to enhance the full and uniform activation of the entire ESD device.

As was shown in FIGS. 2 to 3C and in FIGS. 8 to 12C, the ESD current flows from the first zone to the second zone through at least one detour. In FIGS. 2 to 3C, the detour direction differs from the direct contact-to-channel direction by an angle of approximately 90 degrees. In FIGS. 8 to 12C, the detouring-path direction differs from the direct contact-to-channel direction by an angle of more than 90 degrees (and in certain portions, by 180 degrees). In one aspect, a segment of detour has a larger dimension in the length direction (as the current flow direction) than in the width direction (as across the current flow direction). The detour, in conjunction with at least one gap zone, as well as the second resistivity zone, forms a well distributed resistivity network for improving the uniform activation of the ESD protection device and hence, ESD performance.

The difference in the resistivity between the first and second resistivity zones can be created by various methods. In a first example, the difference in the resistivity is at least caused by different doping concentration, such as n+ doping versus n-well doping as described above. And it is clear that said n-well example can be another n-doped region, or the n-substrate for a p-well process. In a second example, said difference in the resistivity is at least caused by different surface conductivity (such as silicided surface versus non-silicided surface) at the end of IC processing. Further, in this second example, the first and second resistivity zones can have the same or different doping concentrations.

While there are various methods of creating a first resistivity portion and a second resistivity portion in at least one of the doped regions of an ESD protection device, the invention scope is to be fully defined as in the claims.

Figure 12A:
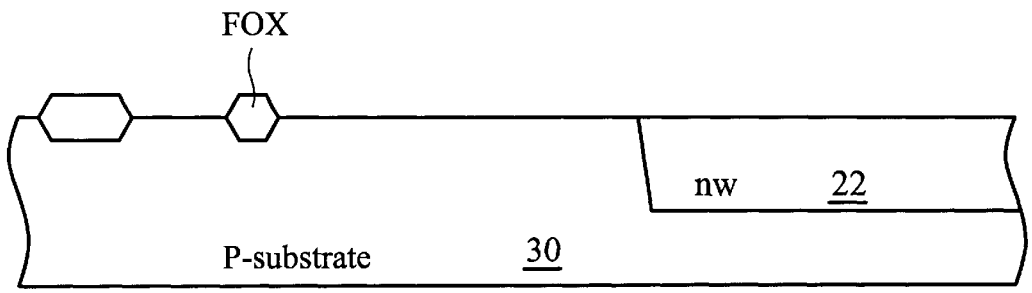
FIGS. 12A to 12C illustrate a formation of an ESD protection device with the isolated island implemented by poly segments and thin gate oxide segments.
Figure 12B:
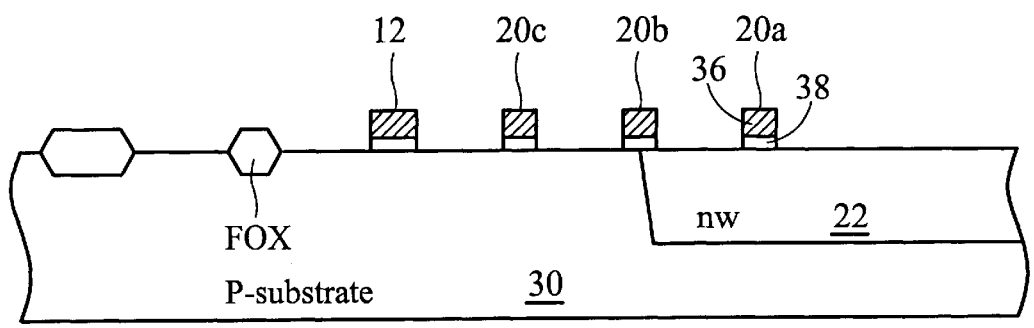
Figure 12C:
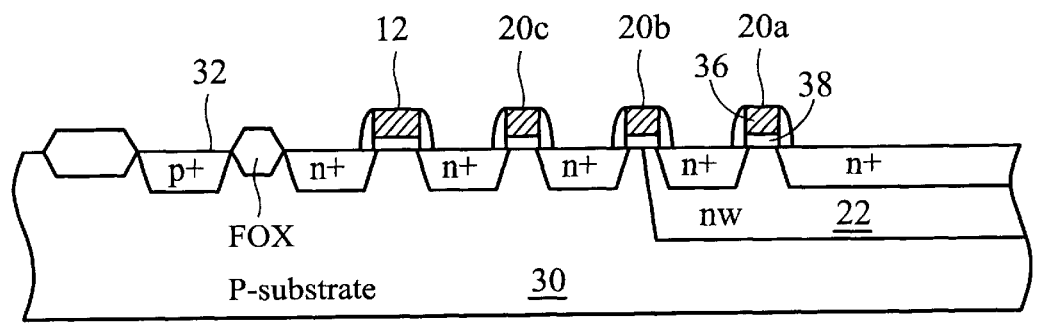

The formation of ESD protection devices is well suited to the conventional IC fabrication process, as well as the advanced salicide process. Formation of an ESD protection device with the isolated islands implemented by poly segments and thin gate oxide segments is illustrated in FIGS. 12A to 12C. First, an n well 22 and p wells (not shown) are formed in the p substrate 30. Then, field oxide regions for defining active regions 14 are formed on the p substrate 30, as shown in FIG. 12A. Subsequent to the formation of field oxide regions, poly gates in company with isolated islands are formed on the surface of the active regions 14 or field oxide regions, as shown in FIG. 12B. The n well 22 of the ESD protection device must be located apart from the poly gate 12 of the ESD protection device by at least a design distance to prevent punch-through. The isolated island 20 has an end separated from either another isolated island or the boundary of an active region 14 to form a gap between. Subsequent implants for forming heavy n-type or p-type doped regions are executed to form the drain diffusion region 14b and the source diffusion region 14a, as shown in FIG. 12C. The optional salicide process can form silicide material (not shown in FIGS.) on the surfaces of the poly, the drain diffusion region or the source diffusion region to increase the circuit operation speed. Finally, interconnection formation process takes place. This includes forming intra-poly dielectric material, contacts, metal lines, all used to interlink the devices in an IC and construct the ESD protection device as shown in FIG. 3A. The interlocked structure of the present invention, as shown in FIG. 8, 10 or 11, can also be implemented by the mentioned forming method with different layout designs.

The ESD protection devices of the present invention solve the potential problem of high standby power consumption in '439 patent, and, furthermore, have a wider adjustable resistance range overcoming the problem imbedded in the '892 patent or the '087 patent. Moreover, the drain capacitance of the ESD protection device according the present invention is greatly reduced and makes the ESD protection device suitable for high-speed operation application.

Finally, while the invention has been described by way of examples and in terms of the preferred embodiment, it is to be understood that the invention is not limited to the disclosed embodiments. On the contrary, it is intended to cover various modifications and similar arrangements as would be apparent to those skilled in the art. For example, the filed-oxide segment in various illustrations described above can be replaced by a trench-isolation segment. Therefore, the scope of the appended claims should be accorded the broadest interpretation so as to encompass all such modifications and similar arrangements.

What is claimed is:

1. An ESD (Electrostatic Discharge) protection device, comprising:
   a semiconductor bulk of a first conductivity type;
   a first doped region of a second conductivity type formed in the semiconductor bulk;
   a second doped region of the second conductivity type formed in the semiconductor bulk;
   a channel region formed between the first doped region and the second doped region;
   a contact region formed within the first doped region; and
   an array of islands distributed in the first doped region to form an electrical path from the contact region to the channel region; wherein the electrical path includes a first section for guiding ESD current towards the channel region and a second section for guiding ESD current flowing away from the channel region.

2. The ESD device as claimed in claim 1, wherein the ESD device further has a well of the second conductivity type on semiconductor bulk overlaying one of the islands.

3. The ESD protect device as claimed in claim 2, wherein the well partially overlaps one of the islands.

4. The ESD protection device as claimed in claim 2, wherein the island entirely overlaps one of the islands.

5. The ESD protection device as claimed in claim 2, wherein one of the islands does not overlap the well.

6. The ESD protection device as claimed in claim 1, wherein each of the islands consists of an isolation layer on the semiconductor bulk and a conductive layer on the isolation layer.

7. The ESD protection device as claimed in claim 1, wherein each of the islands is a field oxide region on the semiconductor bulk.

8. The ESD protection device as claimed in claim 1, wherein the first doped region has silicide material formed on its surface.

9. The ESD protection device as claimed in claim 1, wherein each of the islands has two ends separated from the boundary to form two gaps.

10. The ESD protection device as claimed in claim 1, wherein the first doped region is coupled to a pad and the second doped region is coupled to a power rail.

11. A protection structure of an integrated circuit for improving ESD protection, including:
    a channel region of a second conductivity type; and
    a first doped region of a first conductivity type, comprising:
       a first portion having a first resistivity, comprising at least a first zone, a second zone adjacent to the channel region, and a gap zone connecting the first zone and the second zone; and
       a second portion having a second resistivity, comprising a third zone adjacent to the gap zone and spaced apart from the channel region;

wherein electrostatic-discharge current flows from the first zone to the second zone in part through the gap zone and in part through the second portion for uniform activation of the protection structure.

12. The protection structure as claimed in claim 11, further comprising:
a body on which the first doped region is formed; and
a second doped region having the first conductivity type, formed on the body;
wherein the channel region is located between the first doped region and the second doped region.

13. The protection structure as claimed in claim 11, wherein the protection structure is surrounded by an isolation region, and the gap zone is located between the third zone and the isolation region.

14. The protection structure as claimed in claim 11, wherein the second portion further has a fourth zone, and the gap zone is located between the third zone and the fourth zone.

15. The protection structure as claimed in claim 11, wherein the second resistivity is higher than the first resistivity.

16. The protection structure as claimed in claim 15, further comprising a well region of the first conductivity type, wherein the second portion at least partially overlapping the well region.

17. The protection structure as claimed in claim 16, wherein the second portion fully overlaps the well region.

18. The protection structure as claimed in claim 11, further comprising at least one contact inside the first zone.

19. The protection structure as claimed in claim 18, wherein the first zone is coupled to an IC pad through the contact.

20. The protection structure as claimed in claim 11, further comprising a dielectric segment formed on the second portion.

21. The protection structure as claimed in claim 20, further comprising a conductive segment formed on the dielectric segment.

22. The protection structure as claimed in claim 11, further comprising a dielectric segment formed on the channel region.

23. The protection structure as claimed in claim 22, further comprising a conductive segment formed on the dielectric segment.

24. The protection structure as claimed in claim 11, wherein the first portion has a first surface on which metal silicide is formed.

25. The protection structure as claimed in claim 11, wherein the first portion has a first surface on which metal silicide is formed, and the second portion has a second surface on which a dielectric layer is formed.

26. The protection structure as claimed in claim 25, wherein the dielectric layer is formed directly on the second surface without any metal silicide in between.

27. A protection structure of an integrated circuit for improving ESD protection, comprising:
a channel region of a second conductivity type; and
a first doped region having a first conductivity type, comprising:
a first portion of a first resistivity, comprising at least a first zone with at least one contact, a second zone adjacent to the channel region, and a detour connecting the first zone and the second zone; and
a second portion having a second resistivity, adjacent to the channel region, comprising a third zone and a fourth zone, wherein the third zone is separated from the fourth zone by the detour;
wherein electrostatic-discharge current flows from the first zone to the second zone in part through the detour and in part through the second portion for uniform activation of the protection structure.

28. The protection structure as claimed in claim 27, further comprising:
a body on which the first doped region is formed; and
a second doped region of the first conductivity type on the body;
wherein the channel region is between the first doped region and the second doped region.

29. The protection structure as claimed in claim 27, wherein the detour is in a first direction at an angle substantially perpendicular to a second direction from the contact directly towards the channel region.

30. The protection structure as claimed in claim 27, wherein the detour is in a first direction at an angle larger than 90 degrees from a second direction directly from the contact to the channel region.

31. The protection structure as claimed in claim 27, wherein the second resistivity is higher than the first resistivity.

32. The protection structure as claimed in claim 31, further comprising a well region of a first conductivity type;
wherein the second portion at least partially overlaps the well region.

33. The protection structure as claimed in claim 32, wherein the well region fully overlaps the second portion.

34. The protection structure as claimed in claim 27, wherein the first zone is coupled to a first IC pad through the contact.

35. The protection structure as claimed in claim 34, wherein the second doped region is coupled to a power rail.

36. The protection structure as claimed in claim 27, further comprising a dielectric segment formed on the second portion.

37. The protection structure as claimed in claim 36, further comprising a conductive segment formed on the dielectric segment.

38. The protection structure as claimed in claim 27, further comprising a dielectric segment formed on the channel region.

39. The protection structure as claimed in claim 38, further comprising a conductive segment formed on the dielectric segment.

40. The protection structure as claimed in claim 27, wherein the first portion has a first surface on which metal silicide is formed.

41. The protection structure as claimed in claim 40, wherein the second portion has a second surface on which a dielectric segment is formed.

42. The protection structure as claimed in claim 41, wherein the dielectric segment is formed on the second surface without any metal silicide in between.

43. The protection structure as claimed in claim 27, wherein a segment of the detour has greater length than width.

44. The protection structure as claimed in claim 27, wherein the first portion further comprises a gap zone, and the first zone is connected to the second zone through the detour and the gap zone.

* * * * *